United States Patent
Yun et al.

(10) Patent No.: US 10,393,576 B2
(45) Date of Patent: Aug. 27, 2019

(54) IMAGE SENSOR INCLUDING COLOR FILTER ISOLATION LAYER AND METHOD OF MANUFACTURING THE SAME

(71) Applicant: SAMSUNG ELECTRONICS CO., LTD., Suwon-si (KR)

(72) Inventors: Seokho Yun, Hwaseong-si (KR); Sunghyun Nam, Yongin-si (KR); Sookyoung Roh, Seoul (KR); Hongkyu Park, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/830,649

(22) Filed: Dec. 4, 2017

(65) Prior Publication Data

US 2018/0087960 A1    Mar. 29, 2018

Related U.S. Application Data

(63) Continuation of application No. 14/828,869, filed on Aug. 18, 2015, now Pat. No. 9,863,804.

(30) Foreign Application Priority Data

Aug. 18, 2014    (KR) .................. 10-2014-0106964

(51) Int. Cl.
*H01L 27/146*    (2006.01)
*G01J 1/04*    (2006.01)
(Continued)

(52) U.S. Cl.
CPC ............ *G01J 1/0492* (2013.01); *B32B 38/00* (2013.01); *G02B 5/201* (2013.01);
(Continued)

(58) Field of Classification Search
CPC .................. H01L 27/14621; H01L 31/02162
See application file for complete search history.

(56) References Cited

U.S. PATENT DOCUMENTS

| 8,208,052 B2 | 6/2012 | Hiramoto et al. |
| 8,289,422 B2 | 10/2012 | Hiramoto et al. |
| (Continued) | | |

FOREIGN PATENT DOCUMENTS

| JP | 2009-80313 A | 4/2009 |
| JP | 2009111225 A | 5/2009 |
| (Continued) | | |

OTHER PUBLICATIONS

Communication dated Jan. 18, 2016 issued by the European Patent Office in counterpart European Patent Application No. 15180905.00.

(Continued)

*Primary Examiner* — Thanh Luu
(74) *Attorney, Agent, or Firm* — Sughrue Mion, PLLC

(57) ABSTRACT

An image sensor including a color filter isolation layer and a method of manufacturing the image sensor. The image sensor includes a plurality of color filters that transmit light of a predetermined wavelength band to a light sensing layer. The image sensor also includes an isolation layer disposed between adjacent ones of the plurality of color filters. The isolation layer is formed of a material having a lower refractive index than a refractive index of the color filters, thus totally internally reflecting light incident on the isolation layer from one of the plurality of color filters.

6 Claims, 15 Drawing Sheets

(51) Int. Cl.
 *B32B 38/00* (2006.01)
 *G02B 5/20* (2006.01)
(52) U.S. Cl.
 CPC .. *H01L 27/14621* (2013.01); *H01L 27/14629* (2013.01); *H01L 27/14685* (2013.01); *B32B 2307/40* (2013.01); *H01L 27/14627* (2013.01)

(56) References Cited

U.S. PATENT DOCUMENTS

| | | | |
|---|---|---|---|
| 8,294,076 | B2 | 10/2012 | Nishiwaki et al. |
| 8,384,818 | B2 | 2/2013 | Hiramoto et al. |
| 8,514,319 | B2 | 8/2013 | Hiramoto et al. |
| 8,664,680 | B2 | 3/2014 | Weng et al. |
| 8,921,280 | B2 | 12/2014 | Cho |
| 2008/0055733 | A1 | 3/2008 | Lim |
| 2008/0204580 | A1* | 8/2008 | Holscher ............ H01L 21/31053 348/273 |
| 2010/0245638 | A1* | 9/2010 | Ota .................. H01L 27/14621 348/280 |
| 2010/0253819 | A1 | 10/2010 | Yokozawa |
| 2012/0075509 | A1 | 3/2012 | Ito et al. |
| 2012/0147208 | A1 | 6/2012 | Otsuka et al. |
| 2012/0212656 | A1 | 8/2012 | Hiramoto et al. |
| 2013/0314652 | A1 | 11/2013 | Ryu et al. |
| 2014/0139708 | A1 | 5/2014 | Ota |
| 2014/0339665 | A1* | 11/2014 | Tani ....................... G02B 5/201 257/432 |

FOREIGN PATENT DOCUMENTS

| | | |
|---|---|---|
| JP | 2010232537 A | 10/2010 |
| JP | 2010-272654 A | 12/2010 |
| JP | 4741015 B2 | 8/2011 |
| KR | 10-2010-0091843 A | 8/2010 |
| WO | 2012157730 A1 | 11/2012 |

OTHER PUBLICATIONS

Communication dated May 23, 2016, issued by the European Patent Office in counterpart European Application No. 15180905.0.

Office Action issued in parent U.S. Appl. No. 14/828,869 dated May 8, 2017.

Notice of Allowance issued in parent U.S. Appl. No. 14/828,869 dated Sep. 7, 2017.

* cited by examiner

IMAGE SENSOR INCLUDING COLOR FILTER ISOLATION LAYER AND METHOD OF MANUFACTURING THE SAME

RELATED APPLICATION

This is a continuation of U.S. application Ser. No. 14/828,869 filed on Aug. 18, 2015, which claims priority from Korean Patent Application No. 10-2014-0106964, filed on Aug. 18, 2014, in the Korean Intellectual Property Office, the disclosures of which are incorporated herein in their entirety by reference.

BACKGROUND

1. Field

Apparatuses and methods consistent with exemplary embodiments relate to image sensors and methods of manufacturing the same, and more particularly, to image sensors including a color filter isolation layer capable of preventing crosstalk and loss of light in a peripheral portion of the image sensors and methods of manufacturing the image sensors.

2. Description of the Related Art

Typically, color displays and color image sensors display multicolor images and detect colors of light incident thereon using color filters. Many color displays or color image sensors include an array of a red color filter that transmits only red light, a green color filter that transmits only green light, and a blue color filter that transmits only blue light. Accordingly, a red pixel at which a red color filter is disposed may display or sense only red light, a green pixel at which a green color filter is disposed may display or sense only green light, and a blue pixel at which a blue color filter is disposed may display or sense only blue light. In such a structure, a predetermined color may be represented by adjusting the relative amounts of light output by the red, green, and blue pixels, or a color of incident light may be determined by sensing light incident on the red, green, and blue pixels. In addition to an RGB color filter scheme, a CYGM color filter scheme in which complementary cyan, yellow, green, and magenta color filters are disposed at four respective pixels is used.

An image capturing device may include an objective lens and a color image sensor. The objective lens focuses light incident from the outside onto a color image sensor, and the color image sensor may form an image by sensing the focused light. However, while light incident on pixels in a center portion of the color image sensor, located around an optical axis of the objective lens, is incident at an almost normal angle light incident on pixels at edges of the color image sensor, which are away from the optical axis, is incident at an oblique angle. Various techniques have been suggested in order to form a more exact image, taking into consideration this variation of the incidence angle.

SUMMARY

According to an aspect of an exemplary embodiment, an image sensor includes: a light sensing layer sensing incident light to generate an electrical signal; a color filter layer arranged in a two-dimensional array on the light sensing layer, the color filter layer including a plurality of color filters that transmit light of a predetermined wavelength band to the light sensing layer; and an isolation layer disposed between adjacent ones of the plurality of color filters and formed of a material having a lower refractive index than a refractive index of the plurality of color filters, wherein the isolation layer is interposed between at least one color filter and the light sensing layer or extends to cover a light incident surface of at least one color filter.

The isolation layer may be configured such that a total reflection critical angle at an interface between the color filters and the isolation layer is greater than 45 degrees.

The plurality of color filters may include: a first color filter transmitting light of a first wavelength band; a second color filter transmitting light of a second wavelength band; and a third color filter transmitting light of a third wavelength band, wherein the isolation layer extends among the first through third color filters, on a light incident surface of at least one of the first through third color filters, and between at least one of the first through third color filters and the light sensing layer.

The isolation layer may extend on a light incident surface of the first color filter, and between the second color filter and the light sensing layer, and a thickness of the second color filter may be smaller than a thickness of the first color filter.

The isolation layer may further extend between the third color filter and the light sensing layer, a thickness of the third color filter may be smaller than a thickness of the first color filter, and distances between the light incident surfaces of the first through third color filters and the light sensing layer may be the same as each other.

The image sensor may further include: a color separation element disposed opposite the first color filter and configured to transmit light of the first wavelength band to the first color filter, and to refract or diffract light of the second wavelength band toward the second color filter, and to refract or diffract light of the third wavelength band toward the third color filter.

The image sensor may further include a transparent dielectric layer disposed on the color filter layer, and the color separation element may be fixed and buried within the transparent dielectric layer.

The image sensor may further include a color separation element that is disposed opposite the first color filter and configured to transmit light of the first wavelength band to the first color filter and to refract or diffract light in the second and third wavelength bands toward the second and third color filters.

The color filter layer may include: a first row in which a plurality of first color filters that transmit light of a first wavelength band and a plurality of second color filters that transmit light of a second wavelength band are alternately arranged in a first direction; and a second row in which a plurality of first color filters that transmit light of a first wavelength band and a plurality of third color filters that transmit light of a third wavelength band are alternately arranged in the first direction, and the first row and the second row may be alternately arranged in a second direction perpendicular to the first direction.

The image sensor may further include: a first color separation element disposed opposite the first color filter of the first row and configured to transmit light of the first wavelength band to the first color filter and to refract or diffract light of the second wavelength band to the second color filter; and a second color separation element disposed opposite the first color filter of the second row and configured to transmit light of the first wavelength band to the first color filter and to refract or diffract light of the third wavelength band to the third color filter.

The image sensor may further include a transparent dielectric layer disposed on the color filter layer, and the first and second color separation elements may be fixed and buried within the transparent dielectric layer.

The image sensor may further include a color separation element that is disposed opposite the first color filter of the first row and the second row and configured to transmit light of the first wavelength band to the first color filter and to refract or diffract light in the second and third wavelength bands to the second or third color filter.

The isolation layer may extend on a light incident surface of the first color filter, between the first color filter and the second color filter, and between the second color filter and the light sensing layer in the first row, and the isolation layer may extend on a light incident surface of the first color filter, between the first color filter and the third color filter, and between the third color filter and the light sensing layer in the second row.

Thicknesses of the second and third color filters may be smaller than a thickness of the first color filter, and respective distances between light incident surfaces of the first through third color filters and the light sensing layer may be the same.

A distance between bottom surfaces of the second and third color filters and the light sensing layer may be greater than a distance between a bottom surface of the first color filter and the light sensing layer, and a distance between light incident surfaces of the second and third color filters and the light sensing layer may be greater than a distance between a light incident surface of the first color filter and the light sensing layer.

Side surfaces of the first through third color filters may be inclined.

An internal angle between the bottom surface and the side surface of the first color filter may be smaller than 90 degrees, and an internal angle between the bottom surface and the side surface of the second color filter may be greater than 90 degrees.

An area of the light incident surface of the second color filter may be greater than an area of the light incident surface of the first color filter.

An internal angle between the bottom surface and the side surface of the first color filter may be greater than 90 degrees, and an internal angle between the bottom surface and the side surface of the second color filter may be smaller than 90 degrees.

The isolation layer may extend on a light incident surface of the second color filter, between the second color filter and the first color filter, and between the first color filter and the light sensing layer in the first row.

Also, the isolation layer may extend on a light incident surface of the third color filter, between the first color filter and the third color filter, and between the first color filter and the light sensing layer in the second row.

According to an aspect of another exemplary embodiment, an image capturing apparatus including the above-described image sensor is included.

According to an aspect of another exemplary embodiment, a method of manufacturing an image sensor, includes: providing a light sensing layer that senses incident light to generate an electrical signal; forming a plurality of first color filters transmitting light of a first wavelength, on the light sensing layer at predetermined distances; forming an isolation layer to cover an upper surface of the light sensing layer and side surfaces and light incident surfaces of the plurality of first color filters; and forming a plurality of second color filters transmitting light of a second wavelength band, on the isolation layer between the plurality of first color filters, at predetermined distances, wherein the isolation layer is formed of a material having a lower refractive index than refractive indices of the first and second color filters, and the isolation layer extends on a light incident surface of the first color filter layer and between the second color filter layer and the light sensing layer.

A thickness of the second color filters may be smaller than a thickness of the first color filters, and respective distances between light incident surfaces of the first and second color filters and the light sensing layer may be the same.

A distance between a bottom surface of the second color filter and the light sensing layer may be greater than a distance between a bottom surface of the first color filter and the light sensing layer, and a distance between a light incident surface of the second color filter and the light sensing layer may be greater than a distance between a light incident surface of the first color filter and the light sensing layer.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Figure 1:
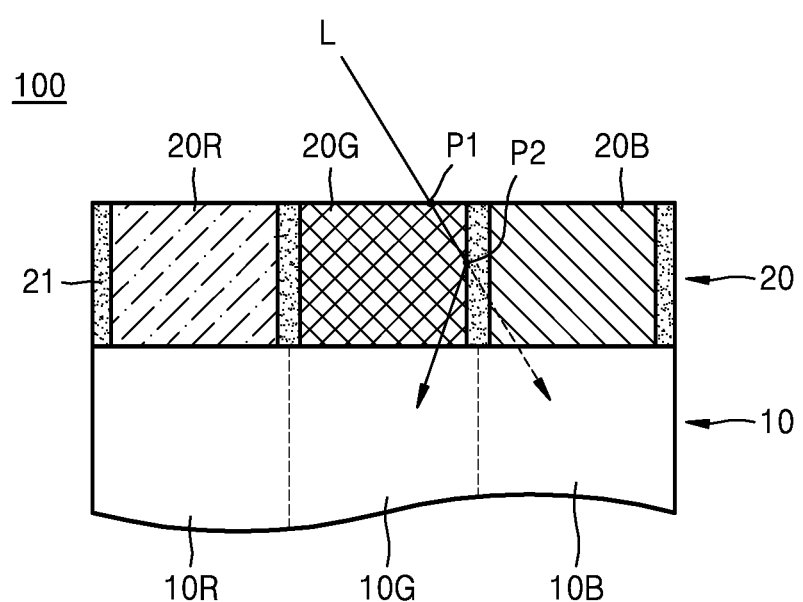
FIG. 1 is a schematic cross-sectional view of a structure of an image sensor according to an exemplary embodiment.

Reference will now be made in detail to exemplary embodiments which are illustrated in the accompanying drawings, wherein like reference numerals refer to like elements throughout. In this regard, the exemplary embodiments may have different forms and should not be construed as being limited to the descriptions set forth herein. Accordingly, exemplary embodiments are merely described below, by referring to the figures, to explain aspects of the present description.

Hereinafter, an image sensor including a color filter isolation layer and a method of manufacturing the image sensor will be described in detail with reference to the accompanying drawings. In the drawings, like reference numbers refer to like elements, and also the size of each element may be exaggerated for clarity of illustration. Embodiments described herein are for illustrative purposes only, and various modifications may be made therefrom. In the following description, when an element is referred to as being "above" or "on" another element in a layered structure, it may be directly on the other element while making contact with the other element or may be above the other element without making contact with the other element.

FIG. 1 is a schematic cross-sectional view of a structure of an image sensor 100 according to an exemplary embodiment. Referring to FIG. 1, the image sensor 100 may include a light sensing layer 10 that senses incident light and thereby generates an electrical signal; a color filter layer 20 that is disposed on the light sensing layer 10 and comprises a plurality of color filters 20R, 20G, and 20B, each of which transmits light of only a desired wavelength band and provides the light sensing layer 10 with the transmitted light; and an isolation layer 21 disposed between adjacent color filters of the color filters 20R, 20G, and 20B.

The light sensing layer 10 may be divided into a plurality of light sensing cells 10R, 10G, and 10B. For example, the plurality of light sensing cells 10R, 10G, and 10B may include a red light sensing cell 10R, a green light sensing cell 10G, and a blue light sensing cell 10B. Although one red light sensing cell 10R, one green light sensing cell 10G, and one blue light sensing cell 10B are illustrated in FIG. 1 for convenience, in practice, there may be a plurality of red light sensing cells 10R, green light sensing cells 10G, and blue light sensing cells 10B, which may be arranged in a two-dimensional (2D) array. The light sensing cells 10R, 10G, and 10B may each independently convert an intensity of incident light into an electrical signal. For example, an electrical signal generated in the red light sensing cell 10R may depend on an intensity of light incident on only the red light sensing cell 10R itself, regardless of the intensities of light incident on other adjacent light sensing cells 10G and 10B. The light sensing layer 10 may be formed of, for example, a charge-coupled device (CCD) or a complementary metal oxide semiconductor (CMOS).

The color filters 20R, 20G, and 20B may be respectively disposed on the light sensing cells 10R, 10G, and 10B that respectively correspond to color filters 20R, 20G, and 20B. For example, the plurality of color filters 20R, 20G, 20B may include a red color filter 20R that transmits light in a red wavelength band, a green color filter 20G that transmits light in a green wavelength band, and a blue color filter 20B that transmits light in a blue wavelength band. Although one red color filter 20R, one green color filter 20G, and one blue color filter 20B are illustrated in FIG. 1 for convenience, in practice, there may be a plurality of red color filters 20R, green color filters 20G, and blue color filters 20B which may be arranged on the light sensing layer 10 in a two-dimensional array.

Although the red color filter 20R, the green color filter 20G, and the blue color filter 20B are arranged in this order in FIG. 1, the order is merely exemplary and the arrangement of the color filters is not limited thereto. Furthermore, the red color filter 20R, the green color filter 20G, and the blue color filter 20B, of the color filter layer 20 according to the present embodiment, are also exemplary, and the color filter layer 20 may also include color filters of other colors. For example, the color filter layer 20 may include cyan, yellow, green, and magenta color filters. Alternatively, filters which transmit other wavelength bands, including an infrared wavelength band, or an ultraviolet wavelength band, may be used. Thus, the specifically-described colors and arrangement orders of the color filters of the color filter layer 20 are merely exemplary for convenience of description.

The isolation layer 21 is disposed between adjacent color filters, thereby optically separating each adjacent pair of the color filters. To this end, the isolation layer 21 may be formed of a material having a lower refractive index than that of the plurality of color filters 20R, 20G, and 20B. For example, the isolation layer 21 may be formed of a material such as a polymethylmetacrylate (PMMA), a silicon acrylate, cellulose acetate butyrate (CAB), a silicon oxide (SiO2), or a fluoro-silicon acrylate (FSA). As long as the refractive index of the isolation layer is lower than that of the adjacent color filters, the isolation layer 21 may be formed of any material. In particular, the isolation layer 21 may be formed using a physical vapor deposition (PVD) method or a chemical vapor deposition (CVD) method used in typical semiconductor processes.

The isolation layer 21 totally internally reflects light that is obliquely incident through light incident surfaces of the respective color filters 20R, 20G, and 20B and which exits through side surfaces of the respective color filters 20R, 20G, and 20B, thereby optically separating each of the color filters 20R, 20G, and 20B from other adjacent color filters 20R, 20G, and 20B. For example, as illustrated in FIG. 1, light L that is incident obliquely on a point P1 on a light incident surface of the green color filter 20G may reach a point P2 on a side surface of the green color filter 20G. The side surface of the green color filter 20G is an interface with the isolation layer 21 which has a lower refractive index than the green color filter 20G. Thus, the light L will be totally internally reflected at the point P2 so as to return to the inside of the green color filter 20G. Thereafter, the light L is incident on the green light sensing cell 10G to contribute to the signal output by the green light sensing cell 10G.

If the isolation layer 21 were not included, the light L would be incident on the blue color filter 20G that is adjacent to the green color filter 20G as denoted by a dotted arrow in FIG. 1. Then the light L would be incident on the blue light sensing cell 10B and would contribute to the signal output by the blue light sensing cell 10B. Consequently, there would be a loss of light in the green light sensing cell 10G, and excessive light incident on the blue light sensing cell 10B, resulting the image formed by the image sensor 100 being formed with inaccurate color information.

Thus, the image sensor 100 of the present embodiment may prevent such loss of light and crosstalk by using the isolation layer 21. Consequently, the light utilization efficiency may be improved and colors may be accurately sensed. In particular, with an image capturing device including the image sensor 100, accurate color information can be obtained even from edge areas of the image sensor 100 on which light is obliquely incident.

Figure 2:
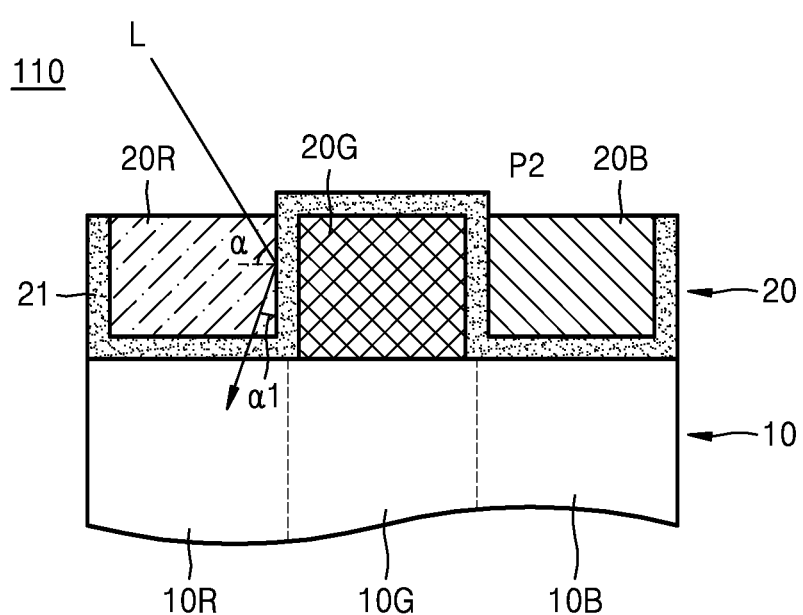
FIG. 2 is a schematic cross-sectional view of a structure of an image sensor according to another exemplary embodiment.

FIG. 2 is a schematic cross-sectional view of a structure of an image sensor 110 according to another exemplary embodiment. Referring to FIG. 2, the isolation layer 21 is disposed between adjacent color filters of the plurality of color filters 20R, 20G, and 20B, and may also be interposed between one or more of the color filters 20R, 20G, and 20B and the light sensing layer 10 or may extend to cover one or more light incident surfaces of the color filters 20R, 20G, and 20B. For example, the isolation layer 21 may extend between the red color filter 20R and the light sensing layer 10, may extend over the light incident surface of the green color filter 20G, and may extend between the blue color filter 20B and the light sensing layer 10. Heights of the red color filter 20R, the green color filter 20G, and the blue color filter 20B may be the same. That is, distances between the light incident surfaces of each of the red color filter 20R, the green color filter 20G, and the blue color filter 20B and the light sensing layer 10 may be the same as each other.

According to the embodiment illustrated in FIG. 2, due to the isolation layer 21 formed on the light sensing layer 10, thicknesses of the red color filter 20R and the blue color filter 20B may be smaller than a thickness of the green color filter 20B by an amount equal to a thickness of the isolation layer 21 on the light sensing layer 10. Thus, by adjusting the thickness of the isolation layer 21 on the light sensing layer 10, the thicknesses of the red color filter 20R and the blue color filter 20B may be easily adjusted. By adjusting the thicknesses of the red color filter 20R and the blue color filter 20B, color spectrum characteristics of the image sensor 110 may be controlled. That is, color characteristics of images obtained by using the image sensor 110 may be adjusted without image signal processing which requires complicated calculation and a long time.

Although the isolation layer 21 is disposed on bottom surfaces of the red color filter 20R and the blue color filter 20B and on the light incident surface of the green color filter 20G in FIG. 2, arrangement of the isolation layer 21 is not limited thereto. Also, although the isolation layer 21 is alternately disposed on bottom surfaces and a light incident surface of the color filters 20R, 20G, and 20B, arrangement of the isolation layer 21 is not limited thereto. The arrangement and the thickness of the isolation layer 21 may vary according to desired color spectrums of the image sensor 110.

The bottom surfaces of the red and blue color filters 20R and 20B contact the isolation layer 21 which has a relatively low refractive index, and thus, light that is totally internally reflected by the side surfaces of the red and blue color filters 20R and 20B may also be totally internally reflected by the bottom surfaces of the red and blue color filters 20R and 20B. In this case, since the light that is totally internally reflected by the bottom surfaces of the red and blue color filters 20R and 20B is not incident on the light sensing layer 10, loss of light may be caused. To prevent the loss of light, a difference in refractive indices of the red and blue color filters 20R and 20B and a refractive index of the isolation layer 21 may be adjusted so as to prevent total internal reflection on the bottom surfaces of the red and blue color filters 20R and 20B.

For example, referring to FIG. 2, when an incident angle of light incident on the side surface of the red color filter 20R is α, an incident angle of light that has been totally internally reflected by the side surface of the red color filter 20R and is incident on the bottom surface of the red color filter 20R is $\alpha1=90°-\alpha$. Also, when a total reflection critical angle between the red color filter 20R and the isolation layer 21 is $\alpha_c$, if light is incident on the side surface of the red color filter 20R at the total reflection critical angle $\alpha_c$, an incidence angle of that same light incident on the bottom surface of the red color filter 20R is $90°-\alpha_c$. Here, if α1 is always smaller than $\alpha_c$, total reflection does not occur on the bottom surface of the red color filter 20R. That is, since $\alpha1=90°-\alpha_c<\alpha_c$, $45°<\alpha_c$. Accordingly, since a total reflection critical angle depends only on the refractive indices of two media, if a refractive index of the isolation layer 21 is determined such that a total reflection critical angle is greater than 45°, total reflection will not occur on the bottom surfaces of the red and blue color filters 20R and 20B.

Figure 3:
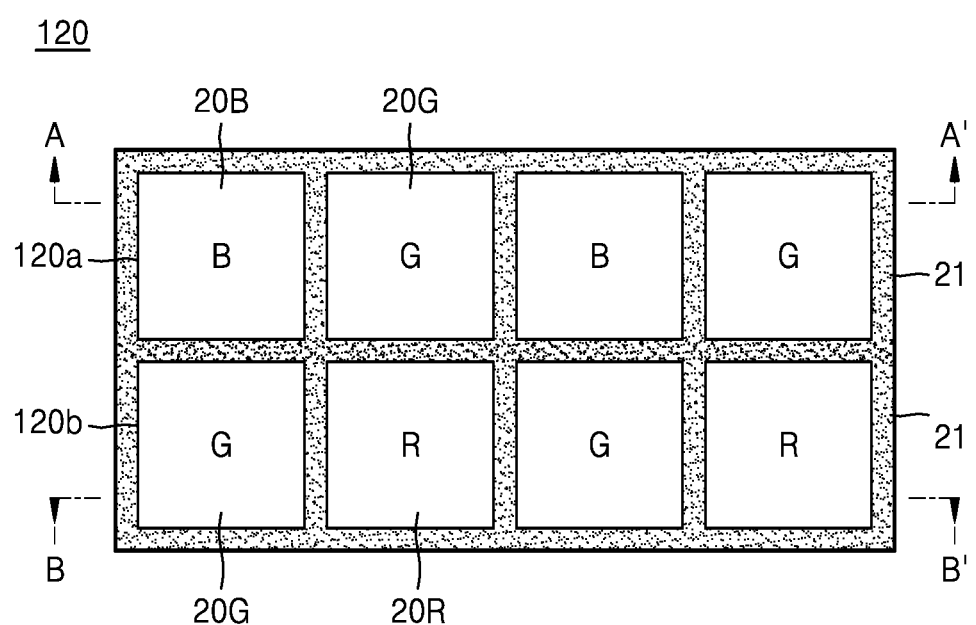
FIG. 3 is a schematic plan view of a pixel structure of an image sensor according to another exemplary embodiment.

FIG. 3 is a schematic plan view of a pixel structure of an image sensor 120 according to another exemplary embodiment. Referring to FIG. 3, the image sensor 120 may include a Bayer pattern in which two green color filters 20G are arranged in a first diagonal direction, and one blue color filter 20B and one red color filter 20R are arranged in a second diagonal direction that intersects the first diagonal direction. The image sensor 120 having a Bayer pattern may include a first pixel row 120a in which a plurality of blue color filters 20B and a plurality of green color filters 20G are alternately arranged in a horizontal direction and a second pixel row 120b in which a plurality of green color filters 20G and a plurality of red color filters 20R are alternately arranged in a horizontal direction. Although only one first pixel row 120a and one second pixel row 120b are illustrated in FIG. 3 for convenience, a plurality of first pixel rows 120a and a plurality of second pixel rows 120b may be alternately arranged in a vertical direction. Also, the isolation layer 21 may be disposed around each of the blue color filters 20B, the green color filters 20G, and the red color filters 20R, as shown.

Figure 4A:
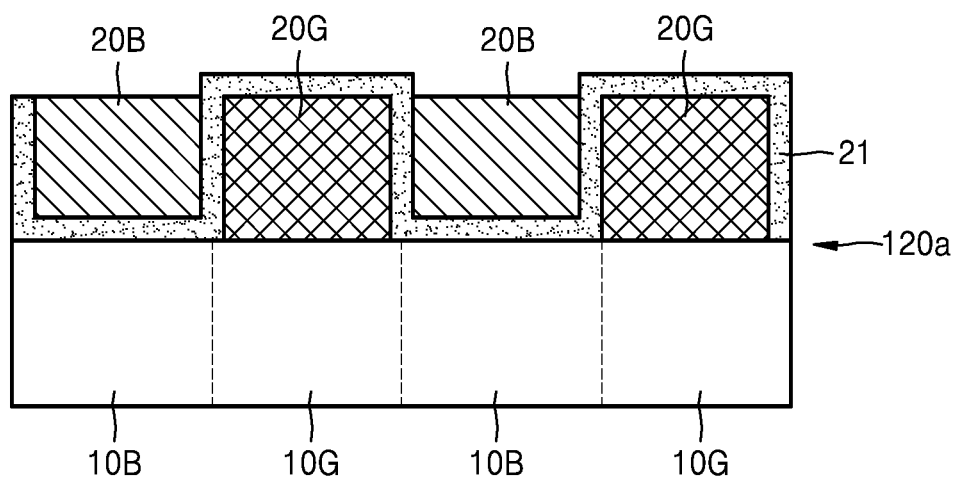
FIG. 4A is a cross-sectional view of a first pixel row of the image sensor of FIG. 3 cut along a line A-A'.

FIG. 4A is a cross-sectional view of the first pixel row 120a of the image sensor 120 of FIG. 3 cut along a line A-A'. Referring to FIG. 4A, a plurality of blue color filters 20B and a plurality of green color filters 20G are alternately arranged on the light sensing layer 10. The blue color filters 20B and the green color filters 20G may be respectively disposed on corresponding blue light sensing cells 10B and corresponding green light sensing cells 10G. The isolation layer 21 may extend between the blue color filter 20B and the light sensing layer 10, between the blue color filter 20B and the green color filter 20G, and on a light incident surface of the green color filter 20G. That is, the isolation layer 21 may extend between adjacent color filters, along a bottom surface of the blue color filter 20B, and along the light incident surface of the green color filter 20G. Thus, a distance between the bottom surface of the blue color filter 20B and the light sensing layer 10 is greater than a distance between a bottom surface of the green color filter 20G and the light sensing layer 10. A height of the light incident surface of the blue color filter 20B may be the same as a height of the light incident surface of the green color filter 20G. That is, a distance between the light incident surface of the blue color filter 20B and the light sensing layer may be the same as a distance between the light incident surface of the green color filter 20G and the light sensing layer 10. Accordingly, a thickness of the blue color filter 20B may be smaller than a thickness of the green color filter 20G by an amount equal to a thickness of the isolation layer 21 on the light sensing layer 10.

Figure 4B:
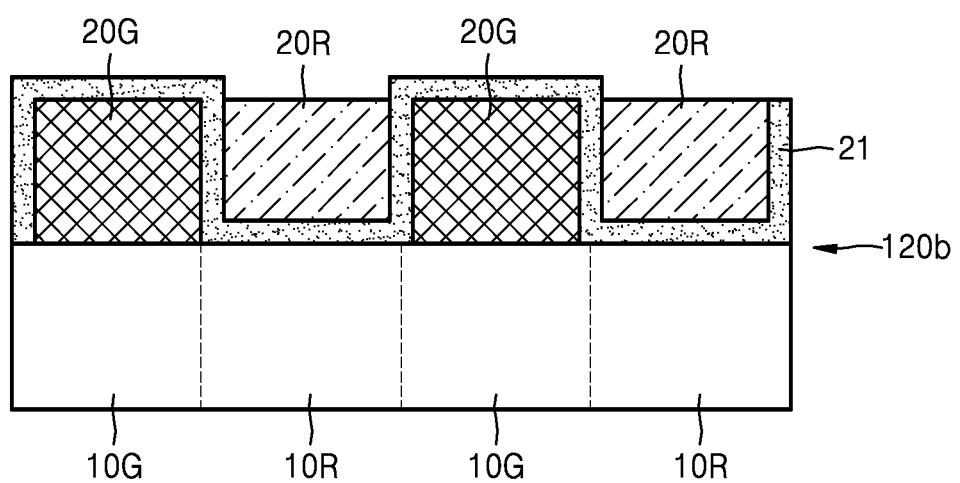
FIG. 4B is a cross-sectional view of a second pixel row of the image sensor of FIG. 3 cut along a line B-B'.

FIG. 4B is a cross-sectional view of the second pixel row 120b of the image sensor 120 of FIG. 3 cut along a line B-B'. Referring to FIG. 4B, a plurality of green color filters 20G and a plurality of red color filters 20R are alternately arranged on the light sensing layer 10. The green color filters 20G and the red color filters 20R may be respectively disposed on corresponding green light sensing cells 10G and corresponding red light sensing cells 10R. The isolation layer 21 may extend between adjacent color filters, along a light incident surface of the green color filter 20G, and between the red color filter 20R and the light sensing layer 10. Thus, a distance between the bottom surface of the red color filter 20R and the light sensing layer 10 is greater than a distance between a bottom surface of the green color filter 20G and the light sensing layer 10. A distance between the light incident surface of the red color filter 20R and the light sensing layer 10 may be the same as a distance between the light incident surface of the green color filter 20G and the light sensing layer 10. Accordingly, a thickness of the red color filter 20R may be smaller than a thickness of the green color filter 20G by an amount equal to a thickness of the isolation layer 21 on the light sensing layer 10.

In FIGS. 4A and 4B, the thicknesses of the blue color filter 20B and the red color filter 20R may be the same or may be different, according to desired color characteristics for the image sensor 120. The thicknesses of the blue color filter 20B and the red color filter 20R may be adjusted based on a thickness of the isolation layer 21 on the light sensing layer 10. For example, when a thickness of the blue color filter 20B is greater than a thickness of the red color filter 20R, a thickness of the isolation layer 21 between the blue color filter 20B and the light sensing layer 10 may be smaller than a thickness of the isolation layer 21 between the red color filter 20R and the light sensing layer 10.

Figure 5A:
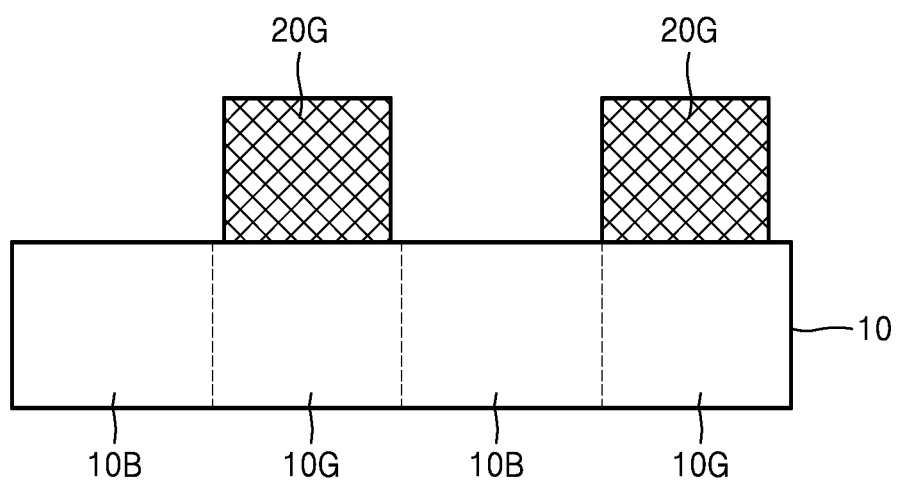
FIGS. 5A through 5C are cross-sectional views illustrating manufacturing processes of the image sensor illustrated in FIG. 3 according to an exemplary embodiment.
Figure 5B:
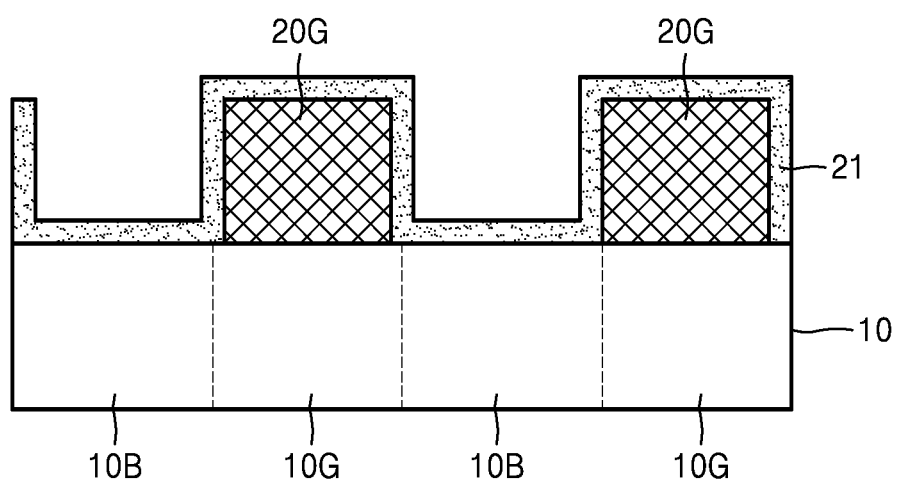
Figure 5C:
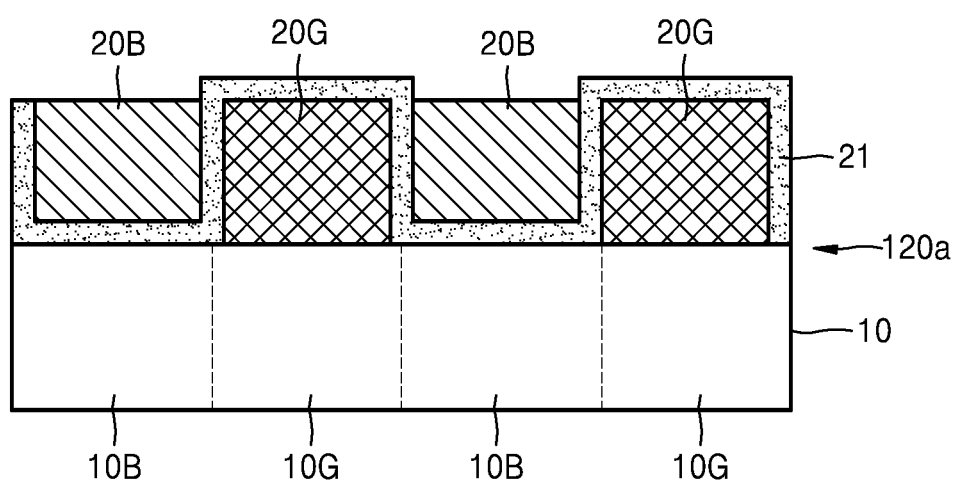

FIGS. 5A through 5C are cross-sectional views illustrating manufacturing processes of the image sensor 120 illustrated in FIG. 3 according to an exemplary embodiment. In detail, manufacturing processes of the first pixel row 120a of the image sensor 120 are illustrated.

First, referring to FIG. 5A, a light sensing layer 10 is provided. The light sensing layer is divided into a plurality of independent light sensing cells 10B and 10G that sense incident light to generate an electrical signal. Although a plurality of blue light sensing cells 10B and a plurality of green light sensing cells 10G are shown in FIG. 5A for convenience, there is no substantial structural difference between the blue light sensing cells 10B and the green light sensing cells 10G. For example, the light sensing layer 10 may be formed of a charge-coupled device (CCD) or a complementary metal oxide semiconductor (CMOS).

Also, a plurality of green color filters 20G that transmit only light in a green wavelength band may be formed on the light sensing layer 10. As illustrated in FIG. 5A, a plurality of green color filters 20G may be disposed on corresponding green light sensing cells 10G and may be spaced apart from one another by a predetermined distance. Although not illustrated, when forming the green color filters 20G in the first pixel row 120a, green color filters 20G of the second pixel row 120b may also be formed at the same time. The green color filters 20G are formed before forming the blue color filters 20B, because the isolation layer 21 is not interposed between the green color filters 20G and the light sensing layer 10. According to another exemplary embodiment, when the isolation layer 21 is formed between the green color filters 20G and the light sensing layer 10, and the isolation layer 21 is not present between the blue color filters 20B and the light sensing layer 10, the blue color filters 20B may be formed before forming the green color filters 20G.

Next, referring to FIG. 5B, the isolation layer 21 may be formed to cover an upper surface of the light sensing layer 10 and side surfaces and light incident surfaces of the plurality of the green color filters 20G. As described above, the isolation layer 21 may be formed of a material having a lower refractive index that of the green color filters 20G or the blue color filters 20B. The isolation layer 21 may be formed by using, for example, a PVD method or a CVD method. As illustrated in FIG. 5B, the isolation layer 21 may have an overall uniform thickness. Alternatively, after forming the isolation layer 21, a thickness of the isolation layer 21 may be partially adjusted by using a chemical mechanical polishing (CMP) method or by etching. For example, a thickness of the isolation layer 21 on a light incident surface of the green color filter 20G may be adjusted, or a thickness of the isolation layer 21 on the blue light sensing cell 10B and the red light sensing cell 10R may be adjusted.

Next, as illustrated in FIG. 5C, a plurality of blue color filters 20B, that transmit only light in a blue wavelength band, may be formed on the isolation layer 21 between the plurality of green color filters 20G. The plurality of blue color filters 20B may be disposed on corresponding blue light sensing cells 10B, and may be arranged at predetermined distances. Although not illustrated, after or before forming the blue color filters 20B in the first pixel row 120a, red color filters 20R may be formed in the second pixel row 120b.

Figure 6A:
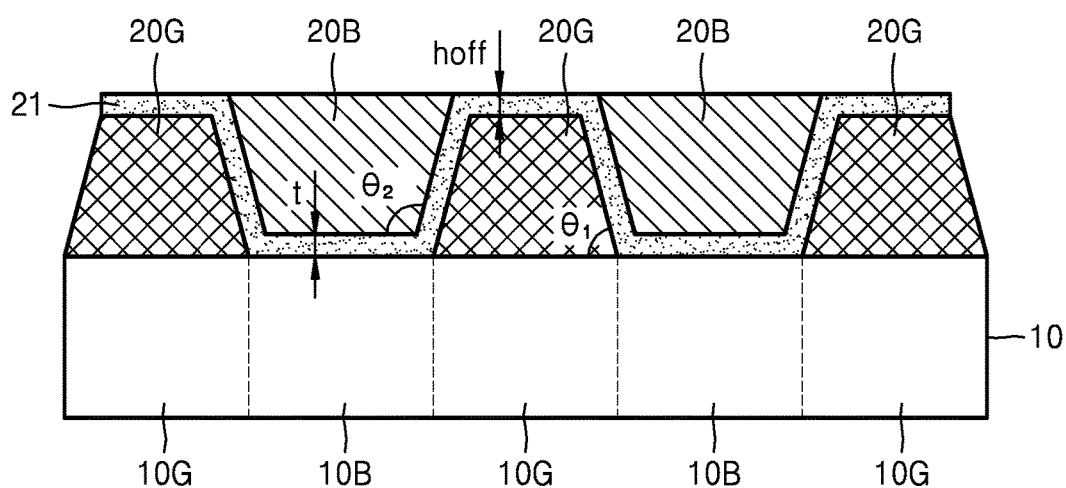
FIGS. 6A and 6B are respectively schematic cross-sectional views of structures of a first pixel row and a second pixel row of an image sensor according to another exemplary embodiment.
Figure 6B:
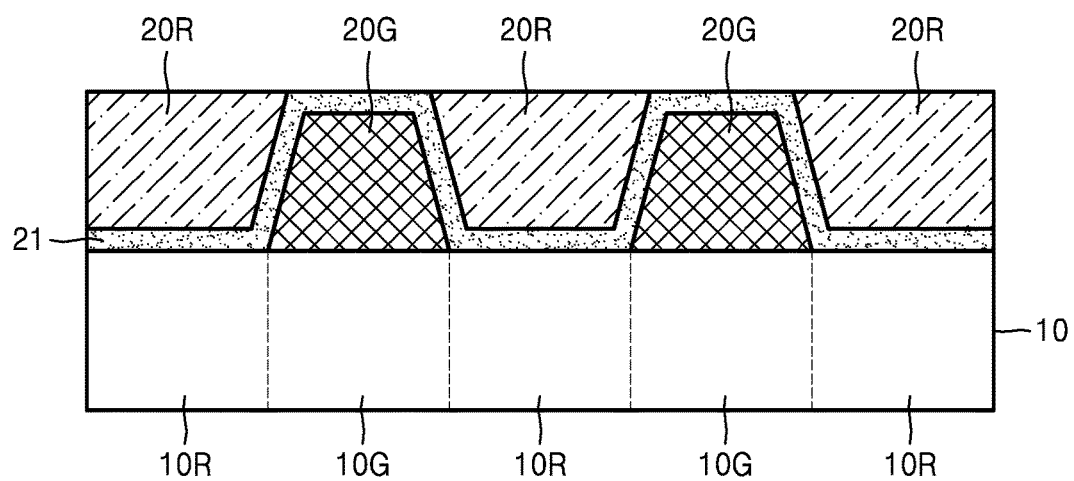

FIGS. 6A and 6B are schematic cross-sectional views of structures of a first pixel row 130a and a second pixel row 130b, respectively, of an image sensor according to another exemplary embodiment Like the first pixel row 120a of the image sensor 120 illustrated in FIG. 4A, the first pixel row 130a illustrated in FIG. 6A includes a plurality of blue color filters 20B and a plurality of green color filters 20G that are alternately arranged. The isolation layer 21 may extend between the blue color filter 20B and the light sensing layer 10, between the blue color filter 20B and the green color filter 20G, and on a light incident surface of the green color filter 20G. Like the second pixel row 120b of the image sensor 120 illustrated in FIG. 4B, the second pixel row 120b illustrated in FIG. 6B includes a plurality of green color filters 20G and a plurality of red color filters 20R that are alternately arranged. The isolation layer 21 may extend on a light incident surface of the green color filter 20G, between the green color filter 20G and the red color filter 20R, and between the red color filter 20R and the light sensing layer 10.

As illustrated in FIGS. 6A and 6B, the plurality of blue color filters 20B, the plurality of green color filters 20G, and the plurality of red color filters 20R may have inclined side surfaces. For example, a first internal angle $\theta 1$ between a bottom surface and a side surface of the green color filter 20G may be smaller than 90 degrees, and a second internal angle $\theta 2$ between a bottom surface and a side surface of the blue color filter 20B or of the red color filter 20R may be greater than 90 degrees. Thus, areas of the light incident surfaces of the blue color filter 20B and the red color filter 20R are greater than areas of the bottom surfaces thereof, and an area of the light incident surface of the green color filter 20G may be smaller than an area of a bottom surface thereof. Also, an area of the light incident surface of the green color filter 20G may be smaller than areas of the light incident surfaces of the blue color filter 20B and the red color filter 20R.

However, the first and second internal angles $\theta 1$ and $\theta 2$ are not limited to the embodiments illustrated in FIGS. 6A and 6B. According to desired color spectrum characteristics of an image sensor, the first internal angle $\theta 1$ between the bottom surface and the side surface of the green color filter 20G and the second internal angle $\theta 2$ between the bottom surface and the side surface of the blue color filter 20B or of the red color filter 20R may be adjusted appropriately. For example, the first internal angle $\theta 1$ may be greater than 90 degrees, and the second internal angle $\theta 2$ may be smaller than 90 degrees. Consequently, relative sizes of the light incident surfaces and the bottom surfaces of the blue color filter 20B and the red color filter 20R and relative sizes of the light incident surface and the bottom surface of the green color filter 20G may be adjusted. In this case, an area of the light incident surface of the green color filter 20G may be greater than areas of the light incident surfaces of the blue color filter 20B and the red color filter 20R.

Also, as illustrated in FIGS. 6A and 6B, heights of the light incident surfaces of the red color filter 20R, the green color filter 20G, and the blue color filter 20B may be different. For example, a height of the light incident surface of the red color filter 20R may be the same as a height of the light incident surface of the blue color filter 20B, and may be higher than a height of the light incident surface of the green color filter 20G. That is, a distance between the light incident surface of the red color filter 20R and the light sensing layer 10 and a distance between the light incident surface of the blue color filter 20B and the light sensing layer 10 may each be greater than a distance between the light incident surface of the green color filter 20G and the light sensing layer 10. To this end, the light incident surfaces of the red color filter 20R and the blue color filter 20B may be formed at the same height as an upper surface of the isolation layer 21 formed on the light incident surface of the green color filter 20G. Also, a distance between the bottom surfaces of the red color filter 20R and the blue color filter 20B and the light sensing layer 10 may be greater than a distance between the bottom surface of the green color filter 20G and the light sensing layer 10.

In the above-described structure, a step off between the light incident surface of the green color filter 20G and the light incident surface of the red color filter 20R and the blue color filter 20B and a thickness t of the isolation layer 21 between the red color filter 20R or the blue color filter 20B and the light sensing layer 10 may be adjusted to thereby adjust the thicknesses of the red color filter 20R and the blue color filter 20B. Thus, color spectrum characteristics of an image sensor may be adjusted by appropriately selecting not only the first and second angles θ1 and θ2 described above but also the step off and the thickness t.

Figure 7:
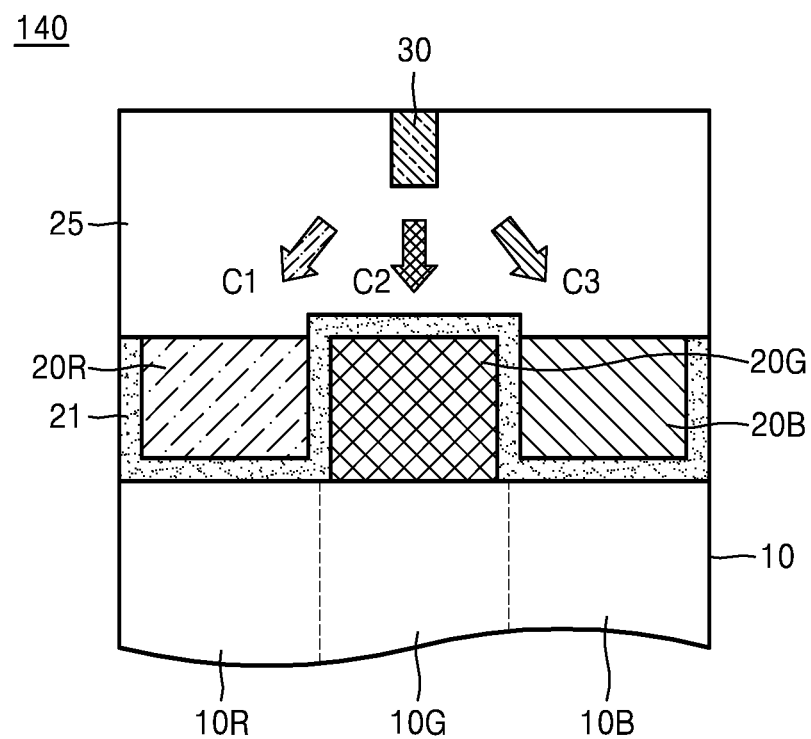
FIG. 7 is a schematic cross-sectional view of a structure of an image sensor according to another exemplary embodiment.

FIG. 7 is a schematic cross-sectional view of a structure of an image sensor 140 according to another exemplary embodiment. Referring to FIG. 7, the image sensor 140 may include a light sensing layer 10 that senses incident light and thereby generates an electrical signal; a color filter layer 20 that is disposed on the light sensing layer 10 and comprises a plurality of color filters 20R, 20G, and 20B; an isolation layer 21 disposed between adjacent color filters of the plurality of color filters 20R, 20G, and 20B; a transparent dielectric layer 25 disposed on the color filter layer 20; and a color separation element 30 that separates incident light according to wavelength, so that light of different wavelength bands proceeds along different paths. Each of the color filters 20R, 20G, and 20B transmits, to the light sensing layer 10, light in only a desired wavelength band. The light sensing layer 10, the color filter layer 20, and the isolation layer 21 may have the same structure and the same function as those of corresponding elements described above with reference to FIG. 2.

The color separation element 30 may separate light into colors by changing a light proceeding path of light according to wavelength by using diffraction or refraction. For example, various shapes, such as a transparent symmetrical or asymmetrical bar shape or a prism shape having an inclined surface, are known in the art as color separation elements 30. The color separation element 30 may be configured in any of various manners according to a desired spectrum distribution of emitted light. For example, as illustrated in FIG. 7, the color separation element 30 may be disposed opposite the green color filter 20G. In this case, the color separation element 30 may be configured to transmit light C2 in a green wavelength band to the green color filter 20G which is directly below the color separation element 30; to refract or diffract light C1 in a red wavelength band toward the red color filter 20R on the left, and to refract or diffract light C3 in a blue wavelength band toward the blue color filter 20B on the right. Alternatively, the color separation element 30 may be configured to transmit light C2 in a green wavelength band to the green color filter 20G, which is right below the color separation element 30, and to refract or diffract mixed light C1+C3, including light in both a red wavelength band and a blue wavelength band, toward the red and blue color filters 20R and 20B on the left and the right.

By using the color separation element 30, an amount of light that is transmitted through the respective color filters 20G, 20R, and 20B increases, and thus, a light utilization efficiency of an image sensor may be improved. Moreover, by using both the color separation element 30 and the isolation layer 21, light separated by using the color separation element 30 may be used more efficiently. Light that is separated by using the color separation element 30 and is incident on the color filters 20G, 20R, and 20B proceeds approximately obliquely. The isolation layer 21 may totally internally reflect the light that proceeds obliquely in the color filters 20G, 20R, and 20B to thereby prevent incidence of light on other adjacent light sensing cells 10R, 10G, and 10B. Thus, a light utilization efficiency and color purity of an image sensor and may be simultaneously improved.

The color separation element 30 may be buried in the transparent dielectric layer 25, such that it is in a fixed position. In order to sufficiently diffract and/or refract incident light, the color separation element 30 may be formed of a material having a higher refractive index than that of the surrounding medium. That is, the refractive index of the color separation element 30 may be higher than a refractive index of the transparent dielectric layer 25. For example, the transparent dielectric layer 25 may be formed of $SiO_2$ or siloxane-based spin on glass (SOG), and the color separation element 30 may be formed of a high-refractive index material such as $TiO_2$, $SiN_3$, ZnS, ZnSe, or $Si_3N_4$. Specific shapes and materials of the color separation element 30 may be varied according to desired color separation characteristics.

Figure 8A:
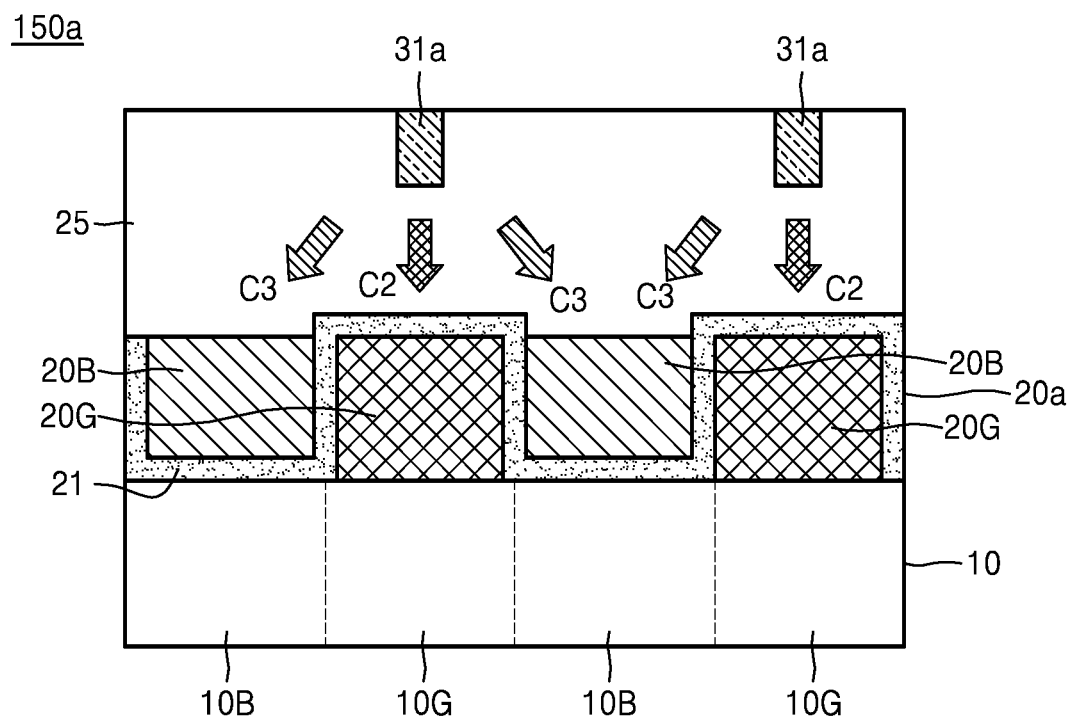
FIGS. 8A and 8B are respectively schematic cross-sectional views of structures of a first pixel row and a second pixel row of an image sensor according to another exemplary embodiment.
Figure 8B:
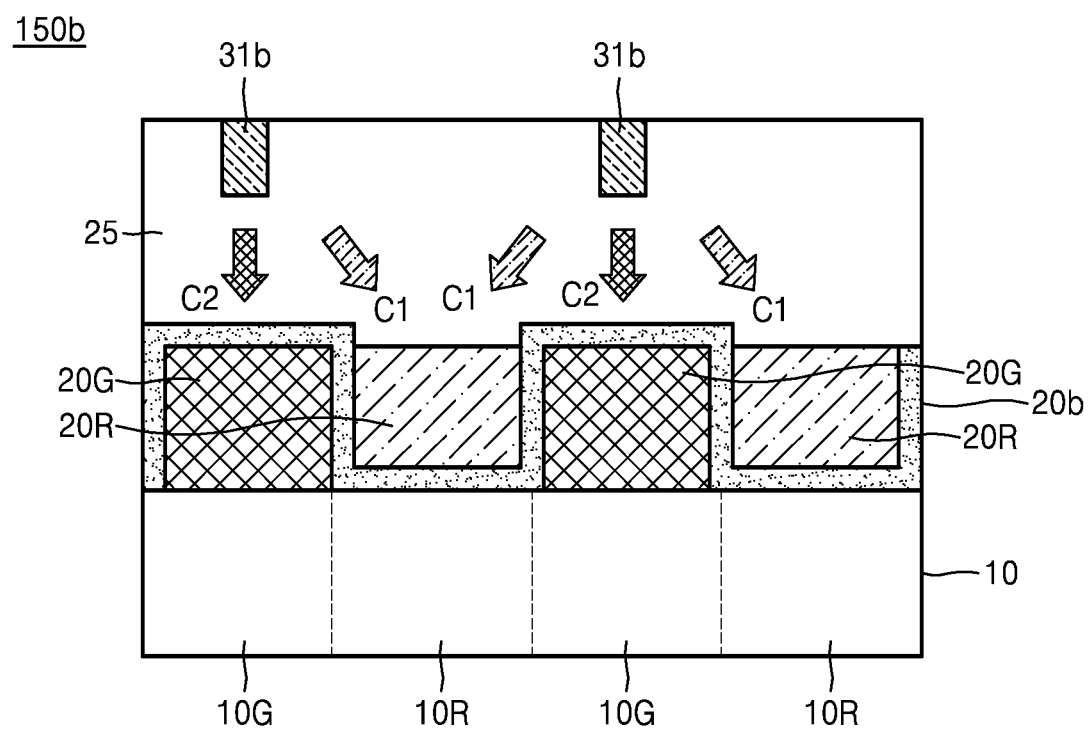

FIGS. 8A and 8B are schematic cross-sectional views of structures of a first pixel row 150a and a second pixel row 150b, respectively, of an image sensor according to another exemplary embodiment. The first pixel row 150a illustrated in FIG. 8A may include a light sensing layer 10; a first color filter layer 20a including a plurality of blue color filters 20B and a plurality of green color filters 20G that are alternately arranged on the light sensing layer 10; an isolation layer 21 that extends between the blue color filter 20B and the light sensing layer 10 and between the green color filter 20G and the blue color filter 20B and along a light incident surface of the green color filter 20G; a transparent dielectric layer 25 disposed on the first color filter layer 20a; and a first color separation element 31a that separates incident light according to wavelength and allows light of different wavelength bands to proceed along different paths. The light sensing layer 10, the first color filter layer 20a, and the isolation layer 21 may have the same structure and the same function as those of corresponding elements described above with reference to FIG. 4A.

Also, the first pixel row 150b illustrated in FIG. 8B may include a light sensing layer 10; a second color filter layer 20b including a plurality of red color filters 20R and a plurality of green color filters 20G that are alternately arranged on the light sensing layer 10; an isolation layer 21 that extends between the red color filter 20R and the light sensing layer 10, between the green color filter 20G and the red color filter 20R, and along a light incident surface of the green color filter 20G; a transparent dielectric layer 25 disposed on the second color filter layer 20b; and a second color separation element 31b that separates incident light according to wavelength and allows light of different wavelength bands to proceed along different paths. The light sensing layer 10, the second color filter layer 20b, and the isolation layer 21 may have the same structure and the same function as those of corresponding elements described above with reference to FIG. 4B.

As illustrated in FIGS. 8A and 8B, the first color separation element 31a and the second color separation element 31b may be buried in the transparent dielectric layer 25, such that they are in fixed positions. Also, the first color separation element 31a may be disposed opposite the green color filter 20G of the first pixel row 150a, and the second color separation element 31b may be disposed opposite the green color filter 20G of the second pixel row 150b, as shown. In the above-described structure, the first color separation element 31a may be configured to transmit light C2 of a green wavelength band to the green color filter 20G, which is right below the first color separation element 31a, and to refract or diffract light C3 of a blue wavelength band toward the blue color filters 20B on the left and the right. Also, the second color separation element 31b may be configured to transmit light C2 of a green wavelength band to the green color filter 20G, which is right below the second color separation element 31b, and to reflect or diffract light C1 of a red wavelength band toward the red color filters 20R on the left and the right.

Alternatively, the first color separation element 31a and the second color separation element 31b may be configured to have the same function. In this case, the first and second color separation elements 31a and 31b may be configured to transmit light C2 of a green wavelength band to the green color filter 20G, which is right below the first and second color separation elements 31a and 31b, and to reflect or diffract mixed light C1+C3, including light in both a red wavelength band and a blue wavelength band, toward the blue color filters 20B or the red color filters 20R that are respectively disposed on the left or the right. Also, the transparent dielectric layer 25 and the first and second color separation elements 31a and 31b illustrated in FIGS. 8A and 8B may also be applied to the image sensors 130a and 130b illustrated in FIGS. 6A and 6B.

Figure 9:
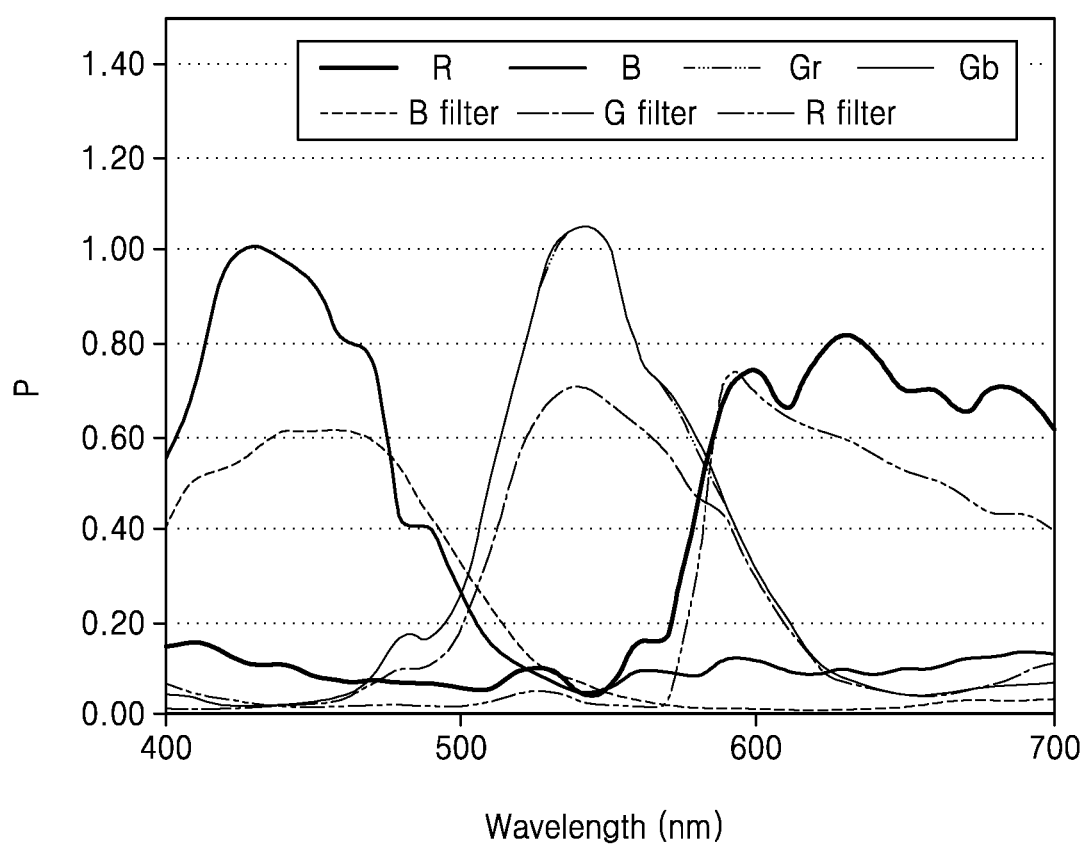
FIG. 9 is a graph exemplarily showing a spectrum distribution of light absorbed by light sensing cells of the image sensor illustrated in FIGS. 8A and 8B.

FIG. 9 is a graph showing an exemplary spectrum distribution of light absorbed by the light sensing cells 10R, 10G, and 10B of the image sensors 150a and 150b illustrated in FIGS. 8A and 8B. In FIG. 9, 'B filter', 'G filter,' and 'R filter' respectively denote spectrum distributions of light that are incident on the blue, green, and red light sensing cells 10B, 10G, and 10R when the first and second color separation elements 31a and 31b are not used. Also, in FIG. 9, 'R' and 'B' respectively denote spectrum distributions of light incident on the red and blue light sensing cells 10R and 10B when the first and second color separation elements 31a and 31b are used, and 'Gb' and 'Gr' respectively denote spectrum distributions of light incident on the green light sensing cell 10G of the first pixel row 150a and the green light sensing cell 10G of the second pixel row 150b when the first and second color separation elements 31a and 31b are used. As can be seen from the graph of FIG. 9, by using the first and second color separation elements 31a and 31b, a light utilization efficiency may be improved as compared to when just the color filters 20G, 20R, and 20B are used.

Figure 10:
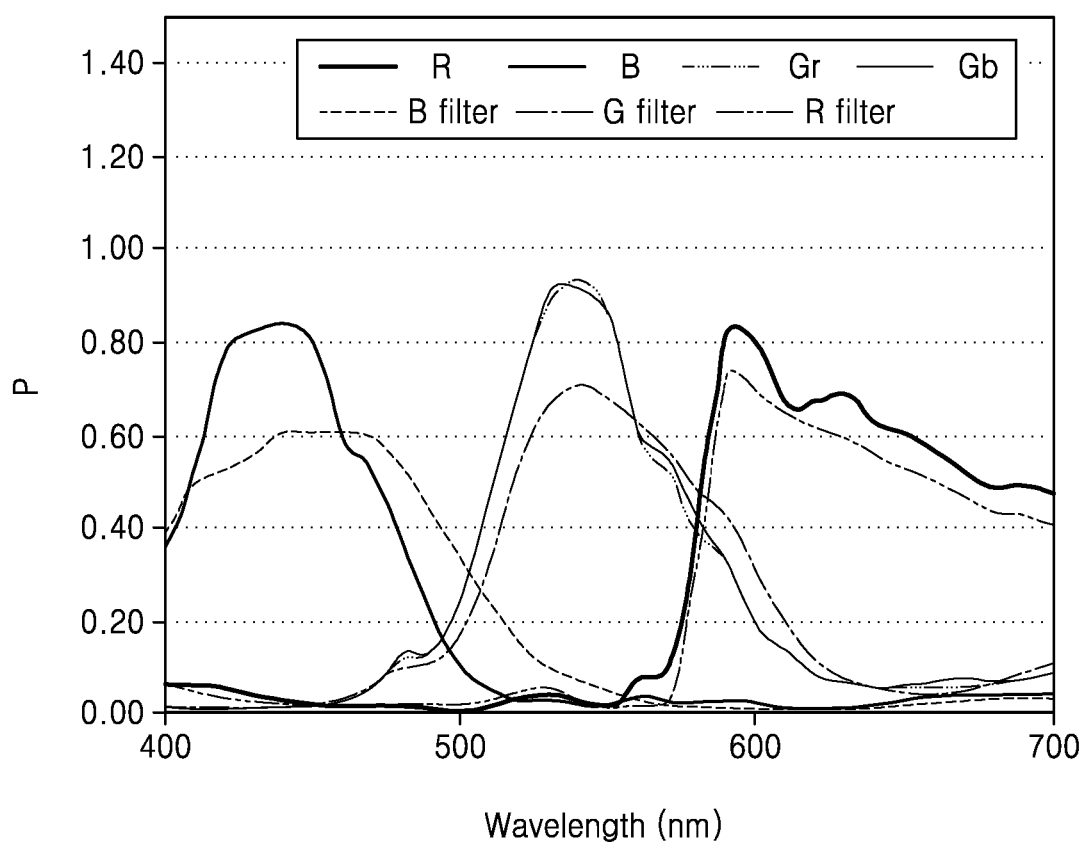
FIG. 10 is a graph exemplarily showing a spectrum distribution of light absorbed by light sensing cells of an image sensor according to a comparative example.

FIG. 10 is a graph showing an exemplary spectrum distribution of light absorbed by light sensing cells 10R, 10G, and 10B of an image sensor according to a comparative example. The image sensor according to the comparative example has almost the same structure as the image sensors 150a and 150b illustrated in FIGS. 8A and 8B except that the isolation layer 21 is not included. That is, in the image sensor according to the comparative example, the color filters 20G, 20R, and 20B and the first and second color separation elements 31a and 31b are included but the isolation layer 21 is not disposed between the color filters 20G, 20R, and 20B. Referring to the graph of FIG. 10, a light utilization efficiency of the image sensor according to the comparative example is relatively high compared to when just the color filters 20G, 20R, and 20B are used. However, the light utilization efficiency of the image sensor according to the comparative example is lower than the light utilization efficiency of the image sensor according to the present exemplary embodiment which further includes the isolation layer 21. Accordingly, the light utilization efficiency may be remarkably increased by using both the isolation layer 21 and the first and second color separation elements 31a and 31b as in the present exemplary embodiment.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more exemplary embodiments have been described with reference to the figures, it will be understood by those of ordinary skill in the art that various changes in form and details may be made therein without departing from the spirit and scope of the present invention as defined by the following claims.

What is claimed is:
1. An image sensor comprising:
a light sensing layer configured to generate an electrical signal using incident light;
a color filter layer disposed on the light sensing layer, wherein the color filter layer comprises a first color filter configured to transmit light in a first wavelength band and a second color filter configured to transmit light in a second wavelength band, different from the first wavelength band; and
an isolation layer disposed between the first color filter and the second color filter, wherein a refractive index of the isolation layer is lower than a refractive index of any one of the first color filter and the second color filter,
wherein the isolation layer is further disposed on a light incident surface of the first color filter and between the second color filter and the light sensing layer,
wherein the isolation layer is not disposed between the first color filter and the light sensing layer, and is not disposed on the light incident surface of the second color filter, and
wherein a surface level of a light incident surface of the second color filter is identical to a surface level of the light incident surface of the first color filter.

2. The image sensor of claim 1, wherein a difference between the refractive index of the isolation layer and the refractive index of the first and second color filters is configured such that a total reflection critical angle at an interface between the first and second color filters and the isolation layer is greater than 45 degrees.

3. The image sensor of claim 1, wherein a thickness of the second color filter is smaller than a thickness of the first color filter.

4. The image sensor of claim 1, wherein a distance between the light incident surface of the first color filter and the light sensing layer is the same as a distance between the light incident surface of the second color filter and the light sensing layer.

5. The image sensor of claim 1, further comprising:
a transparent dielectric layer disposed on the color filter layer; and
a color separation element fixed within the transparent dielectric layer, disposed opposite the first color filter, and configured to transmit light in the first wavelength band to the first color filter and to refract or diffract light in the second wavelength band toward the second color filter.

6. An image sensor comprising:
a light sensing layer configured to generate an electrical signal using incident light;
a color filter layer disposed on the light sensing layer, wherein the color filter layer comprises a first color filter configured to transmit light in a first wavelength band and a second color filter configured to transmit light in a second wavelength band, different from the first wavelength band;
an isolation layer disposed between the first color filter and the second color filter, wherein a refractive index of the isolation layer is lower than a refractive index of any one of the first color filter and the second color filter; and
a color separation element that is disposed opposite the first color filter and configured to transmit light in the first wavelength band to the first color filter and to refract or diffract light in the second wavelength band,
wherein the isolation layer is further disposed on a light incident surface of the first color filter and between the second color filter and the light sensing layer, and
wherein a surface level of a light incident surface of the second color filter is identical to a surface level of the light incident surface of the first color filter.

\* \* \* \* \*